United States Patent
More et al.

(10) Patent No.: US 10,476,492 B2
(45) Date of Patent: Nov. 12, 2019

(54) STRUCTURES AND OPERATIONS OF INTEGRATED CIRCUITS HAVING NETWORK OF CONFIGURABLE SWITCHES

(71) Applicant: Intel Corporation, Santa Clara, CA (US)

(72) Inventors: Ankit More, San Mateo, CA (US);
Jason M. Howard, Portland, OR (US);
Robert Pawlowski, Beaverton, OR (US); Fabrizio Petrini, Menlo Park, CA (US); Shaden Smith, Mountain View, CA (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 16/201,915

(22) Filed: Nov. 27, 2018

(65) Prior Publication Data

US 2019/0109590 A1 Apr. 11, 2019

(51) Int. Cl.
*H03K 17/00* (2006.01)
*G11C 7/10* (2006.01)
*H03K 19/173* (2006.01)

(52) U.S. Cl.
CPC ......... *H03K 17/005* (2013.01); *H03K 17/007* (2013.01); *H03K 19/1733* (2013.01); *G11C 7/1006* (2013.01)

(58) Field of Classification Search
CPC combination set(s) only.
See application file for complete search history.

(56) References Cited

U.S. PATENT DOCUMENTS

| | | | | |
|---|---|---|---|---|
| 6,138,185 A | * | 10/2000 | Nelson | G06F 13/4022 710/317 |
| 8,145,880 B1 | * | 3/2012 | Cismas | G06F 15/17381 712/11 |
| 9,619,410 B1 | * | 4/2017 | Brandenberger | G06F 13/20 |

* cited by examiner

*Primary Examiner* — An T Luu
(74) *Attorney, Agent, or Firm* — Schwabe, Williamson & Wyatt, P.C.

(57) ABSTRACT

Embodiments herein may present an integrated circuit including a switch, where the switch together with other switches forms a network of switches to perform a sequence of operations according to a structure of a collective tree. The switch includes a first number of input ports, a second number of output ports, a configurable crossbar to selectively couple the first number of input ports to the second number of output ports, and a computation engine coupled to the first number of input ports, the second number of output ports, and the crossbar. The computation engine of the switch performs an operation corresponding to an operation represented by a node of the collective tree. The switch further includes one or more registers to selectively configure the first number of input ports and the configurable crossbar. Other embodiments may be described and/or claimed.

25 Claims, 6 Drawing Sheets

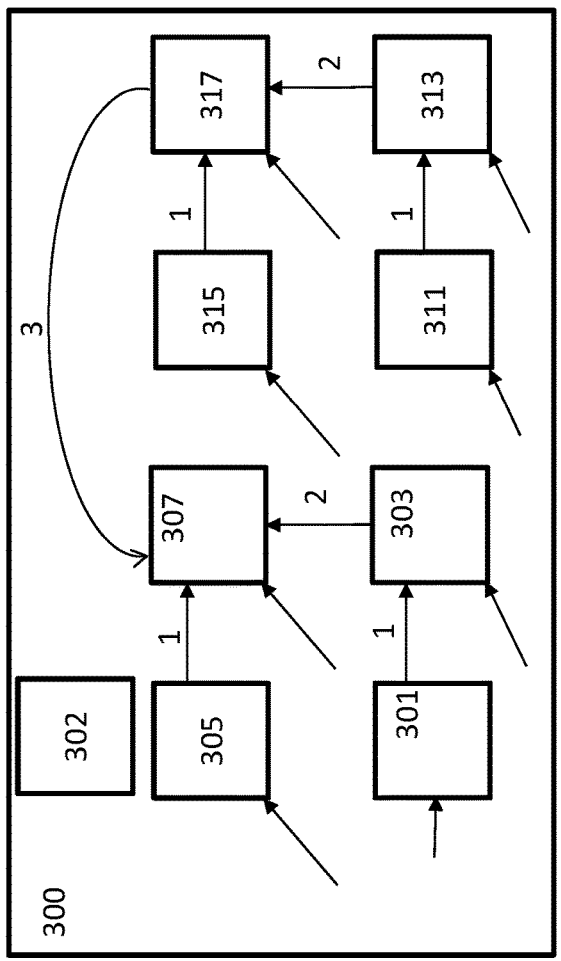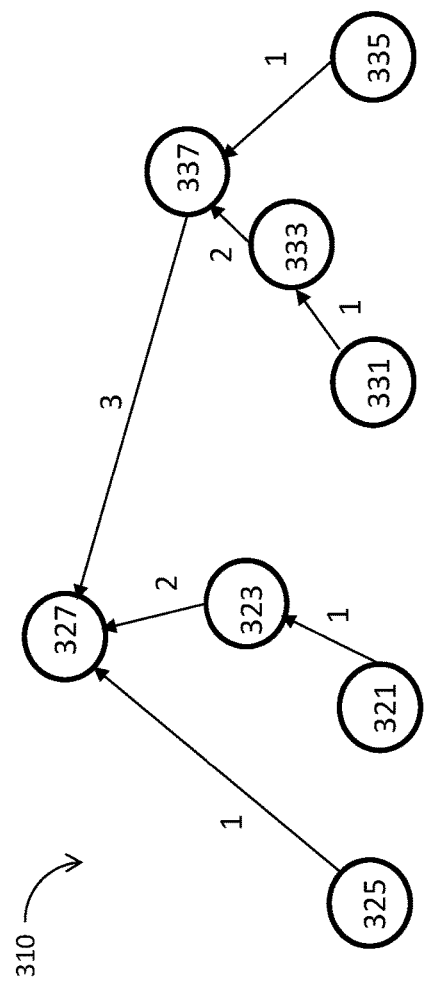
Figure 3(a)
Figure 3(b)

STRUCTURES AND OPERATIONS OF INTEGRATED CIRCUITS HAVING NETWORK OF CONFIGURABLE SWITCHES

FIELD

Embodiments of the present disclosure relate generally to the technical field of computing, and more particularly to computing using integrated circuits, each having a network of configurable switches.

BACKGROUND

The background description provided herein is for the purpose of generally presenting the context of the disclosure. Unless otherwise indicated herein, the materials described in this section are not prior art to the claims in this application and are not admitted to be prior art by inclusion in this section.

In various applications, e.g., training deep neural networks, graph analysis, a large number of parallel operations needs to be performed on a large amount of data. Software techniques may be used to provide solutions to such parallel applications. For example, multiple threads may be used to perform the parallel computations, with a butterfly pattern of communication between threads. However, such software techniques may require multiple reads and writes to memory, resulting in less than desirable performance, due to limited memory bandwidth.

BRIEF DESCRIPTION OF THE DRAWINGS

Embodiments will be readily understood by the following detailed description in conjunction with the accompanying drawings. To facilitate this description, like reference numerals designate like structural elements. Embodiments are illustrated by way of example and not by way of limitation in the figures of the accompanying drawings.

FIGS. 3(a)-3(b) illustrate another example integrated circuit including a network of configurable switches to perform a sequence of operations represented by a collective tree, in accordance with various embodiments.

DETAILED DESCRIPTION

Figure 1:
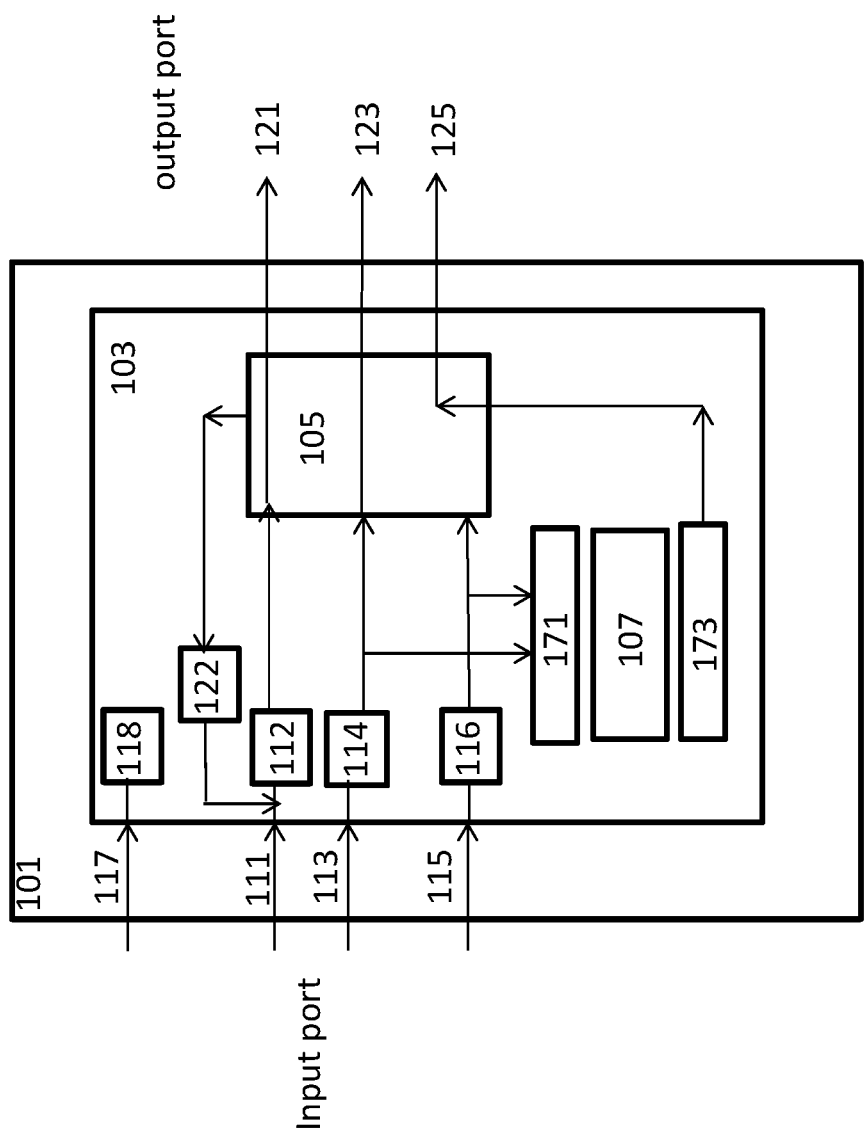
FIG. 1 illustrates an example configurable switch that can be coupled together with other switches to form a network of switches within an integrated circuit to perform a sequence of operations, in accordance with various embodiments.

Apparatuses, methods, and storage medium are disclosed herein related to the structures and operations of integrated circuits (ICs), each having switches configurable to form a network of switches within an IC, to jointly perform parallel operations. A large number of parallel operations may be performed on a large amount of data in various applications. Software based solutions to such parallel applications may have performance limited by memory bandwidth. For example, some software based solutions may only progress at approximately 25-30% of the peak rate supported by the processors, due to the multiple accesses to memory used in the software based solutions.

Embodiments herein may present hardware techniques and mechanisms to perform parallel operations on a large amount of data. The operations may be jointly performed by one or more ICs, each having a network of switches. The switches may operate at peak memory bandwidth. In embodiments, a sequence of operations may be mapped to one or more ICs, each having a network of switches, in an energy efficient manner by minimizing the data movement between the switches. In detail, a switch of the network of switches is configurable to specify whether an input port of the switch is to supply the data as operands to an operation, to pass through data to an output port of the switch, or neither to pass through the data nor to supply the data as the operand. A sequence of operations may be represented as a collective tree and mapped to the one or more ICs with the network of switches so that operations may be performed in a pipelined manner. A computation engine of a switch is to perform the operation when the operands of the operation are available from the input ports of the switch. The operations may follow a forward path of the one or more network of switches to reach a switch representing a root of the collective tree. Accordingly, memory access is performed only once in the forward path and to write the final result. Hence, the one or more network of switches may perform the sequence of operations close to peak performance. In addition, the operations may follow a reverse path of the one or more network of switches at each switch, to broadcast data or operation results to all the input ports that participated in the operation in the forward path.

Embodiments herein may present an integrated circuit including one or more switches, where the switches form a network of switches to perform a sequence of operations according to a structure of a collective tree. In detail, a switch includes a first number of input ports, a second number of output ports, a configurable crossbar to selectively couple the first number of input ports to the second number of output ports, and a computation engine coupled to the first number of input ports, the second number of output ports, and the crossbar. The computation engine of the switch performs an operation corresponding to an operation represented by a node of the collective tree. The switch further includes one or more registers to selectively configure the first number of input ports and the configurable crossbar, to enable the first number of input ports to selectively pass data to the computation engine to supply the computation engine with operands of the operation. The computation engine is to perform an operation and provide results of the operation to a first group of output ports of the second number of output ports. For example, the computation engine is to selectively route results of the operation to the first group of output ports of the second number of output ports, or to enable the first number of input ports to pass through data to a second group of output ports of the second number of output ports.

Embodiments herein may present an integrated circuit including a plurality of switches. Each switch includes a first number of input ports and a second number of output ports selectively coupled to one or more of a number of input ports of one or more other switches to form a network of switches on a die. Each switch further includes a computation engine configurable to be coupled to selected ones of the first number of input ports, and selected ones of the second number of output ports to perform an operation corresponding to a node of a collective tree. The network of switches are configurable to cooperate with other network of switches of other ICs to jointly take on a network topology reflective of the collective tree, and performs a sequence of operations represented by the collective tree.

Embodiments herein may present a method for performing computations. The method includes selectively passing data, from a first number of input ports of a first switch of an integrated circuit, to a computation engine of the first switch to supply the computation engine with operands of an operation, or to a first group of output ports of a second number of output ports of the first switch to bypass the computation engine of the first switch. The method further includes performing, by the computation engine of the first switch, the operation when all operands of the operation are passed from the first number of input ports. In addition, the method includes forwarding results of the operation to a second group of output ports of the second number of output ports of the first switch. Moreover, the method includes repeating the selectively passing, the performing, and the forwarding on at least a second switch of the integrated circuit coupled to the first switch.

In the description to follow, reference is made to the accompanying drawings that form a part hereof wherein like numerals designate like parts throughout, and in which is shown by way of illustration embodiments that may be practiced. It is to be understood that other embodiments may be utilized and structural or logical changes may be made without departing from the scope of the present disclosure. Therefore, the following detailed description is not to be taken in a limiting sense, and the scope of embodiments is defined by the appended claims and their equivalents.

Operations of various methods may be described as multiple discrete actions or operations in turn, in a manner that is most helpful in understanding the claimed subject matter. However, the order of description should not be construed as to imply that these operations are necessarily order dependent. In particular, these operations may not be performed in the order of presentation. Operations described may be performed in a different order than the described embodiments. Various additional operations may be performed and/or described operations may be omitted, split or combined in additional embodiments.

For the purposes of the present disclosure, the phrase "A or B" and "A and/or B" means (A), (B), or (A and B). For the purposes of the present disclosure, the phrase "A, B, and/or C" means (A), (B), (C), (A and B), (A and C), (B and C), or (A, B and C).

The description may use the phrases "in an embodiment," or "in embodiments," which may each refer to one or more of the same or different embodiments. Furthermore, the terms "comprising," "including," "having," and the like, as used with respect to embodiments of the present disclosure, are synonymous.

As used hereinafter, including the claims, the term "module" or "routine" may refer to, be part of, or include an Application Specific Integrated Circuit (ASIC), an electronic circuit, a processor (shared, dedicated, or group) and/or memory (shared, dedicated, or group) that execute one or more software or firmware programs, a combinational logic circuit, and/or other suitable components that provide the described functionality.

Where the disclosure recites "a" or "a first" element or the equivalent thereof, such disclosure includes one or more such elements, neither requiring nor excluding two or more such elements. Further, ordinal indicators (e.g., first, second or third) for identified elements are used to distinguish between the elements, and do not indicate or imply a required or limited number of such elements, nor do they indicate a particular position or order of such elements unless otherwise specifically stated.

The terms "coupled with" and "coupled to" and the like may be used herein. "Coupled" may mean one or more of the following. "Coupled" may mean that two or more elements are in direct physical or electrical contact. However, "coupled" may also mean that two or more elements indirectly contact each other, but yet still cooperate or interact with each other, and may mean that one or more other elements are coupled or connected between the elements that are said to be coupled with each other. By way of example and not limitation, "coupled" may mean two or more elements or devices are coupled by electrical connections on a printed circuit board such as a motherboard, for example. By way of example and not limitation, "coupled" may mean two or more elements/devices cooperate and/or interact through one or more network linkages such as wired and/or wireless networks. By way of example and not limitation, a computing apparatus may include two or more computing devices "coupled" on a motherboard or by one or more network linkages.

As used herein, the term "circuitry" may refer to, be part of, or include an Application Specific Integrated Circuit (ASIC), an electronic circuit, a processor (shared, dedicated, or group), and/or memory (shared, dedicated, or group) that execute one or more software or firmware programs, a combinational logic circuit, and/or other suitable hardware components that provide the described functionality. As used herein, "computer-implemented method" may refer to any method executed by one or more processors, a computer system having one or more processors, a mobile device such as a smartphone (which may include one or more processors), a tablet, a laptop computer, a set-top box, a gaming console, and so forth.

FIG. 1 illustrates an example configurable switch 103 of an IC that can be coupled together with other switches of the IC or other ICs to form a network of switches to perform a sequence of operations, in accordance with various embodiments. For clarity, features of the configurable switch 103 may be described below as an example for understanding a switch of an IC that can be coupled together with other switches of the IC or other ICs to form a network of switches to perform a sequence of operations. It is to be understood that there may be more or fewer components included in the switch 103. Further, it is to be understood that one or more of the devices and components within the switch 103 may include additional and/or varying features from the description below, and may include any device that one having ordinary skill in the art would consider and/or refer to as a configurable switch that can be coupled together with other switches to form a network of switches to perform a sequence of operations.

In embodiments, the switch 103 is included in an IC 101, which may be on a die. The IC 101 may include multiple other switches, not shown, to facilitate formation of a network of switches to perform a sequence of operations. In some other embodiments, the switch 103 may be a part of a network on chip (NoC), or a part of a network of switches in a system fabric.

In embodiments, the switch 103 includes a first number of input ports, e.g., an input port 111, an input port 113, an input port 115, and an input port 117; a second number of output ports, e.g., an output port 121, an output port 123, and an output port 125. The switch 103 further includes a configurable crossbar 105, and a computation engine 107. The configurable crossbar 105 is to selectively couple the input ports, e.g., the input port 111, the input port 113, or the input port 115, to the output ports, e.g., the output port 121, the output port 123, or to the computation engine 107. The computation engine 107 is coupled to the input ports, e.g., the input port 115, the output ports, e.g., the output port 125, and the crossbar 105, to perform an operation and provide results of the operation to some output ports, e.g., the output port 125. In addition, the switch 103 includes one or more registers, e.g., a register 112, a register 114, a register 116, a register 118, a register 122, a register 171, or a register 173, to selectively configure the input ports and the configurable crossbar 105, to enable the input ports to selectively pass data to the computation engine 107 to supply the computation engine 107 with operands of the operation; the computation engine 107 to selectively route results of the operation to the output ports, e.g., the output port 125; or to enable the input ports, e.g., the input port 111, the input port 113, to pass through data to the output ports, e.g., the output port 121, the output port 123. The number of input ports, the output ports, and the number of registers are for illustration only and are not limiting. There may be a different number of input ports, output ports, or registered to be implemented for the switch 103. For example, the a register 112, the register 114, the register 116, the register 118, the register 122, the register 171, and the register 173 may be combined into one larger register to indicate all the information for the functions of individual registers.

In embodiments, the computation engine 107 is arranged to perform an operation when the operands of the operation are available from the input ports, e.g., the input port 113 and the input port 115, and further to route results of the operation to the output ports, e.g., the output port 125. The computation engine 107 may include a tree of arithmetic and logic units (ALU) to perform the operation. The operation to be performed by the computation engine 107 may include a selected operation of a vector operation, a scalar operation, or a matrix operation, while the data passing through the input ports may be a scalar value, a matrix, or an array. In some embodiments, the operation performed by the computation engine 107 corresponds to an operation represented by a node of a collective tree, where the switch 103 together with other switches forms a network of switches to perform a sequence of operations according to a structure of the collective tree. Further details of the operations performed by a network of switches according to a structure of the collective tree are shown in FIG. 3.

In embodiments, an input port, e.g., the input port 111, the input port 113, the input port 115, or the input port 117, includes a configuration register to indicate whether the input port is to pass through data to an output port, to supply the data as an operand in the operation to be performed by the computation engine, or neither to pass through the data nor to supply the data as the operand. For example, the input port 111 includes a configuration register 112 to indicate the input port 111 is to pass through data to the output port 121, the input port 113 includes a configuration register 114 to indicate the input port 113 is to pass through data to the output port 123, the input port 115 includes a configuration register 116 to indicate the input port 115 is to supply the data as an operand in the operation to be performed by the computation engine 107, while the input port 117 includes a configuration register 118 to indicate the input port 117 is neither to pass through the data nor to supply the data as the operand.

In some embodiments, the configuration register may store a bit vector to indicate the use of the data from the input port. For example, a bit vector with a length equal to the number of output ports plus 1 may be used in the configuration registers. For a (n+1)-bit vector, each bit of the first n bits corresponds to an output port, while the last bit may correspond to an computation engine. Other configuration may be used to indicate data from an input port is routed to the computation engine or to an output port.

In embodiments, for example, a bit vector [1000] may be stored in the configuration register 112 to indicate that the input port 111 is coupled to the output port 121, but not to be coupled to any other output ports, and neither to the computation engine 107. For the 4-bit vector [1000], each bit of the first three bits corresponds to an output port, while the last bit may correspond to the computation engine 107. There may be many different implementations to indicate such connections between the input port, the output ports, and the computation engine. For example, the first bit or any other specifically designed bit of the bit vector may represent whether the input port is to supply the data as the operand in an operation to be performed by the computation engine 107. A connection may be represented by a bit value 0 or a bit value 1. For example, a bit vector [01111] may also be used to indicate that the input port 111 is coupled to the output port 121 only. On the other hand, a 4-bit vector [0000] stored in the configuration register 118 may indicate the input port 117 is neither to pass through the data nor to supply the data as the operand.

In embodiments, there may be only one bit of the bit vector to be set to a value different from a default value, to indicate that the input port may pass through data to an output port, or to supply the data as an operand in the operation to be performed by the computation engine, but not both. Furthermore, bit vectors of different input ports may be mutually exclusive so that an output port is to receive an input from only one input port, based on an one-to-one mapping between the input ports and the output ports.

In embodiments, some of the input ports may be bidirectional and include multiple configuration registers in both directions. For example, the configuration register 112 is a first register of the input port 111, and the input port 111 further includes a configuration register 122 to indicate the input port 111 is to receive data from an output port, e.g., the output port 121. The configuration register 112 may be referred to as a request configuration register for a forward path from the input port 111 to the output port 121. On the other hand, the configuration register 122 may be referred to as a response configuration register of the input port 111 for a reverse path from the output port to the input port.

In embodiments, the computation engine 107 may include the register 171 to indicate input ports, e.g., the input port 113 and the input port 115, to supply the operands of the operation, and the register 173 to indicate the output ports, e.g., the output port 125, to route the results of the operation. In embodiments, there may be only one output port 125 to receive the results of the operation from the computation engine 107. The output port 125 is only to receive the results of the operation from the computation engine 107 and not to receive data from the input ports. On the other hand, the output port 121 and the output port 123 are to receive data from the input ports, e.g., the input port 111 and the input port 113 and not to receive the results of the operation from the computation engine 107.

In embodiments, similar to the registers to the input ports, the register 171 may include an input bit vector representing the input ports participating in the operation performed by the computation engine 107. For example, the register 171 may include a bit vector [0110] to represent the data for the input port 113 and the input port 115 are supplied to the computation engine 107 as operands for the operation to be performed by the computation engine 107, while the data for the input port 111 and the input port 117 are not supplied as operands. In general, the bit vector stored in the register 171 may have a length equal to the number of input ports. Based on the bit vector stored in the register 171, the computation engine 107 may determine when all the operands from participating input ports are ready so that the computation engine 107 may perform the operation. Hence, the computation engine 107 may perform the operation in a pipelined manner. In embodiments, when the connections are bidirectional, and the computation engine 107 may broadcast the operation results back to the input ports supplying the operands, the computation engine 107 may perform the broadcast based on the bit vector stored in the register 171.

In embodiments, the register 173 may store a bit vector to indicate how the computation engine 107 is to selectively route results of the operation to the output ports. For example, the register 173 may store a bit vector [001] to indicate that the computation engine 107 is to selectively route results of the operation to the output port 125, not the output port 121 or the output port 123. In general, the bit vector stored in the register 173 may have a length equal to the number of output ports. In some embodiments, the bit vector stored in the register 173 may be referred to as a forwarding bit vector, indicating the output ports to send the operation results by the computation engine 107. In some embodiments, only one bit in the forwarding bit vector is set to indicate that the operation results of the computation engine 107 is only forwarded to one output port. Furthermore, the forwarding bit vector may be mutually exclusive with the configuration bit vectors of the input ports to ensure the operation results of the computation engine 107 is not forwarded on an output port that also receives data from an input port.

Figure 2:
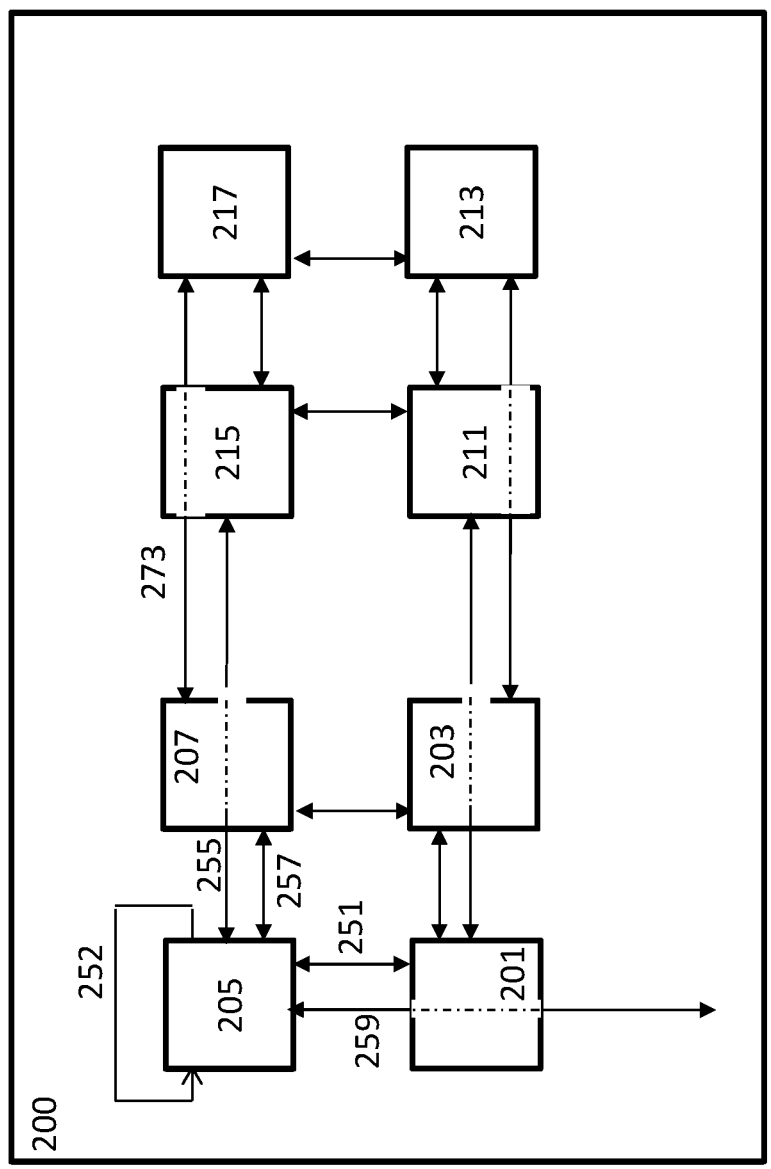
FIG. 2 illustrates an example integrated circuit including a network of configurable switches to perform a sequence of operations, in accordance with various embodiments.

FIG. 2 illustrates an example integrated circuit 200 including a network of configurable switches to perform a sequence of operations, on its own or in cooperation with other like ICs, in accordance with various embodiments. In embodiments, the integrated circuit 200 includes a switch 201, a switch 203, a switch 205, a switch 207, a switch 211, a switch 213, a switch 215, and a switch 217, among which at least some of them are configurable. Any of the switches included in the integrated circuit 200 may be an example of the switch 103 as shown in FIG. 1 and described above for FIG. 1.

In embodiments, the switches in the integrated circuit 200 may be different from each other. For example, a first switch, e.g., the switch 215, includes first number of input ports and the second number of output ports, while a second switch, e.g., the switch 217, includes a third number of input ports, and a fourth number of output ports, where the first number is different from the third number, or the second number is different from the fourth number.

In embodiments, a first switch in the integrated circuit 200 may be coupled to a second switch by communication links coupling an output port of the first switch to an input port of the second switch. For example, the switch 205 is coupled to the switch 207 through a link 257, where the link 257 is to couple an output port of the switch 205 to an input port of the switch 207. In some embodiments, the link between two switches may be bidirectional where an input port may also serve as an output port. For example, the link 257 may be bidirectional and the output port of the switch 205 coupled to the link 257 may be an input port of the switch 205 as well. Similarly, the switch 205 is further coupled to the switch 201 through a link 251, coupled to the switch 215 through a link 255, and coupled to other switches not shown through a link 259. In addition, the switch 205 may include a link 252 coupling an input port of the switch 205 to an output port of the switch 205.

In embodiments, a switch of the switch 201, the switch 203, the switch 205, the switch 207, the switch 211, the switch 213, the switch 215, the switch 217, includes a computation engine configurable to be coupled to selected ones of the input ports, and selected ones of the output ports of the switch to perform an operation. The operation to be performed by the computation engine of a switch includes a selected operation of a vector operation, a scalar operation, or a matrix operation. In addition, any switch may further includes: one or more registers to selectively configure the input ports, to enable the input ports selectively pass data to an computation engine of the switch to supply the computation engine with operands of the operation, and the computation engine to selectively route the results of the operation to a first group of output ports, or the first number of input ports to selectively pass through data to a second group of output ports of the output ports.

In more detail, as shown in FIG. 3, the operation performed by any of the switches may correspond to a node of a collective tree, and the network of switches are configurable to jointly take on a network topology reflective of the collective tree, and performs a sequence of operations represented by the collective tree. The network topology may be a hypercube, a butterfly, a mesh, or any other regular network topology, or irregular network topology.

FIGS. 3(a)-3(b) illustrate another example integrated circuit 300 including a network of configurable switches to perform a sequence of operations represented by a collective tree, in accordance with various embodiments. In embodiments, the integrated circuit 300 may be similar to the integrated circuit 200, and includes a switch 301, a switch 302, a switch 303, a switch 305, a switch 307, a switch 311, a switch 313, a switch 315, and a switch 317. Any of the switches included in the integrated circuit 300 may be an example of the switch 103 as shown in FIG. 1 and described above for FIG. 1.

In embodiments, each switch of the switch 301, the switch 303, the switch 305, the switch 307, the switch 311, the switch 313, the switch 315, and the switch 317 may perform an operation corresponding to a node of a collective tree 310. The network of switches are configurable to jointly take on a network topology reflective of the collective tree 310, and performs a sequence of operations represented by the collective tree 310, where the collective tree 310 is mapped on to the network topology of the switches. In addition, the switch 302 may not be mapped to any node of the collective tree 310. For example, a node 321, a node 323, a node 325, and a node 327 may be mapped to the switch 301, the switch 303, the switch 305, and the switch 307, respectively. Similarly, a node 331, a node 333, a node 335, and a node 337 may be mapped to the switch 311, the switch 313, the switch 315, and the switch 317, respectively. The group of switches of the network of switches corresponding to the nodes of the collective tree 310, e.g., the switch 301, the switch 303, the switch 305, the switch 307, the switch 311, the switch 313, the switch 315, and the switch 317 does not have a circular path according to the network topology. Hence, the operations performed by the group of switches corresponding to the nodes of the collective tree 310 can be performed in a deadlock-free pipelined manner.

In embodiments, similar to the switch 103, each switch of the switch 301, the switch 303, the switch 305, the switch 307, the switch 311, the switch 313, the switch 315, and the switch 317 includes a first number of input ports and a second number of output ports selectively coupled to one or more of a number of input ports of one or more other. In addition, each switch further includes a computation engine configurable to be coupled to selected ones of the first number of input ports, and selected ones of the second number of output ports to perform the operation corresponding to a node of the collective tree 310. Furthermore, each switch includes one or more registers to selectively configure the first number of input ports, to enable the first number of input ports selectively pass data to the computation engine to supply the computation engine with operands of the operation, and the computation engine to selectively route the results of the operation to a first group of output ports of the second number of output ports, or the first number of input ports to selectively pass through data to a second group of output ports of the second number of output ports. In some embodiments, the collective tree 310 is mapped on to the network topology using configuration bit vectors, as described for the switch 103 in FIG. 1.

In embodiments, for the collective tree 310, a node may have a layer number marked on an edge starting from the node. For example, the node 321, the node 325, the node 331, and the node 335 may be a first layer node; the node 323 and the node 333 may be a second layer node; the node 337 may be a third layer node; while the node 327 may be a root node of the collective tree 310. The collective tree 310 is shown for example only, and is not limiting. There may be other kind of collective trees to represent a sequence of operations.

In embodiments, a switch of the IC 300 may also have a layer number marked on a link starting from the switch to represent the order of operations to be performed by the switch. For example, the switch 301, the switch 305, the switch 311, and the switch 315 may be configured to pass data through from an input port to an output port, which may be a first order of operation. The switch 303, or the switch 313 may perform a second order of operation on the inputs to the switch. The switch 317 may perform a third order of operation when all the inputs to the switch 317 are received from the switch 315, the switch 313, and the input directly to the switch 317. In addition, the switch 307 may perform a root operation on the inputs to the switch 307, when all the inputs to the switch 307 are received from the switch 305, the switch 303, the switch 317, and the input directly to the switch 307.

In embodiments, a switch has one or more descendent switches corresponding to one or more nodes of the collective tree that are descendent nodes of the node to which the switch corresponds. For example, the switch 301 and the switch 303 correspond to the node 321 and the node 323, the node 321 is a descendent node of the node 323. Hence, the switch 301 is a descendent switch of the switch 303. Similarly, the switch 317 may have the switch 311, the switch 315, and the switch 313 as the descendent switches. In embodiments, the computation engine of a switch performs the operation when all descendent switches have performed their operations. For example, the switch 317 is to perform its operation when all descendent switches, e.g., the switch 311, the switch 315, and the switch 313, have performed the operations.

In embodiment, the switch 307 is the root switch corresponding to the root node 327 of the collective tree 310. The root switch 307 is to perform an operation represented by the root node 327 of the collective tree 310 after all other switches of the group of corresponding switches, e.g., the switch 301, the switch 303, the switch 305, the switch 311, the switch 313, the switch 315, and the switch 317, have performed operations represented by all other nodes of the collective tree except the root node.

In some embodiments, when some of the links between the switches are bidirectional, the root switch 307 may be further configurable to broadcast a result of the operation performed by the root switch 307, to at least some of the other switches of the group of corresponding switches, e.g., the switch 301, the switch 303, the switch 305, the switch 311, the switch 313, the switch 315, and the switch 317. For example, the root switch 307 may broadcast the operation result on a reverse path from the root switch 307 to the switch 317, the switch 305, and the switch 303. In some embodiments, the broadcast by a switch may be aided by registers with a bit vector to indicate input ports of the switch to supply the operands of the operation, so that the operation result is broadcast to the input ports of the switch in the reverse direction.

Before further describing the IC based computation technology of the present disclosure, it should be noted for ease of understanding, the collective tree is mapped to a network of switches within an IC, with a topology reflective of the collective tree, in various embodiments, the collective tree may be substantially larger with the topology mapped to the network switches of a number of ICs, spanning more than one IC.

Figure 4:
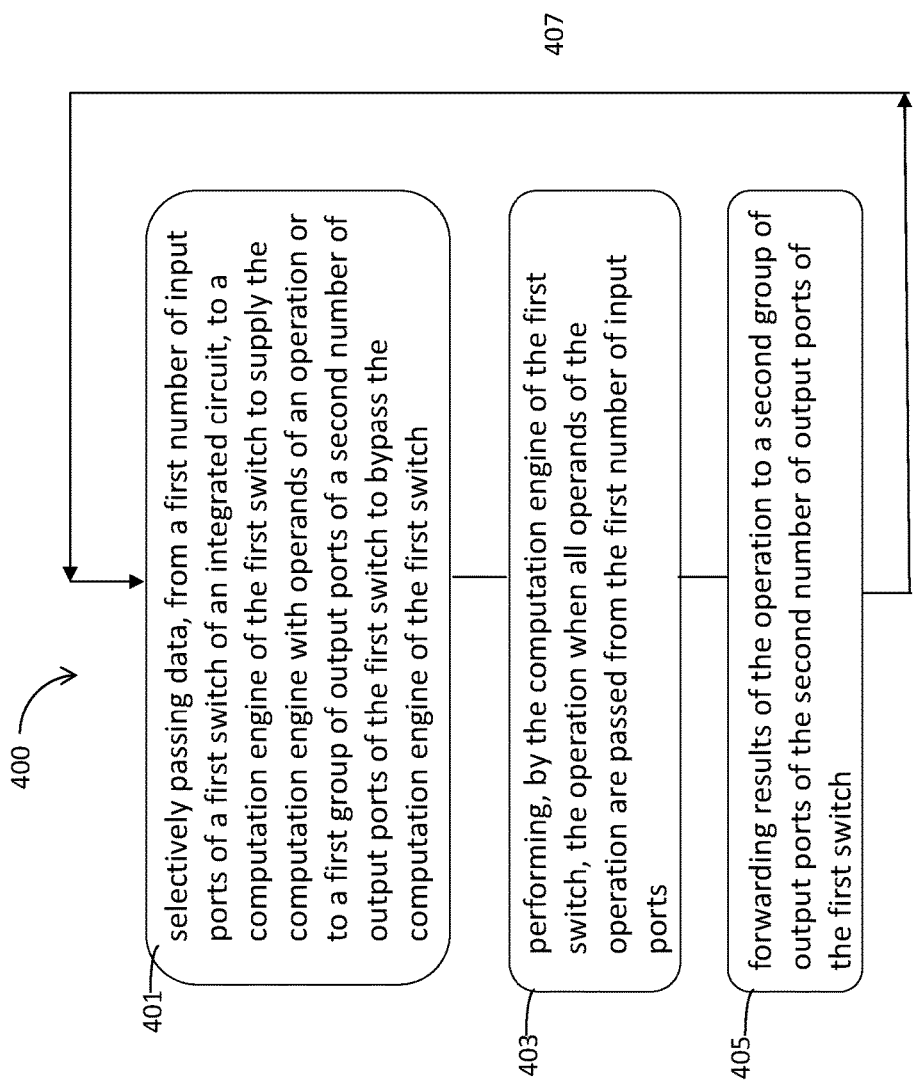
FIG. 4 illustrate an example process for performing operations on a switch of a network of configurable switches within an integrated circuit, in accordance with various embodiments.

FIG. 4 illustrate an example process 400 for performing operations on a switch of a network of configurable switches of one or more ICs, in accordance with various embodiments. In embodiments, the process 400 may be performed by the switch 103, any switch of the switches of the IC 200, or any switch of the switches of the IC 300.

The process 400 may start at an interaction 401. During the interaction 401, data are selectively passed from a first number of input ports of a first switch of an integrated circuit, to a computation engine of the first switch to supply the computation engine with operands of an operation or to a first group of output ports of a second number of output ports of the first switch to bypass the computation engine of the first switch. For example, at the interaction 401, data are selectively passed from the input port 113 and the input 115 to the computation engine 107 of the switch 103 to supply the computation engine 107 with operands, while data are passed from the input port 111 and the input 113 to the output port 121 and the output port 123 to bypass the computation engine 107 of the switch 103. In embodiments, the selectively passing may include selectively passing in accordance with connectivity information configured in one or more registers, e.g., the register 112, the register 114, the register 116, the register 118, the register 122, the register 171, or the register 173.

During an interaction 403, when all operands of the operation are passed from the input ports to the computation engine, the operation is performed by the computation engine of the first switch. For example, at the interaction 403, when all operands of the operation are passed from the input port 113 and the input 115 to the computation engine 107, the operation is performed by the computation engine 107. The operation to be performed may be a vector operation, a scalar operation, or a matrix operation.

During an interaction 405, results of the operation are to be forwarded to a group of output ports of the first switch. For example, at the interaction 405, results of the operation are to be forwarded to the output port 125.

During an interaction 407, the selectively passing, the performing, and the forwarding are to be repeated on at least a second switch of the integrated circuit coupled to the first switch. For example, the interaction 401, the interaction 403, and the interaction 405, may be performed by the switch 313, and the switch 317 is to repeat the selectively passing, the performing, and the forwarding operations for operands supplied by the switch 313, the switch 315, and data supplied by the switch 317 itself. The operations by the switch 313, the switch 317 are performed as part of a performance of a sequence of operations represented by the collective tree 310 using a network of switches on the integrated circuit 300. The performance of the selectively passing, the performing, and the forwarding on the switch 313 corresponding to performance of an operation of the node 333 of the collective tree 310, while the performance of operations on the switch 317 corresponding to performance of an operation of the node 337 of the collective tree 310.

Figure 5:
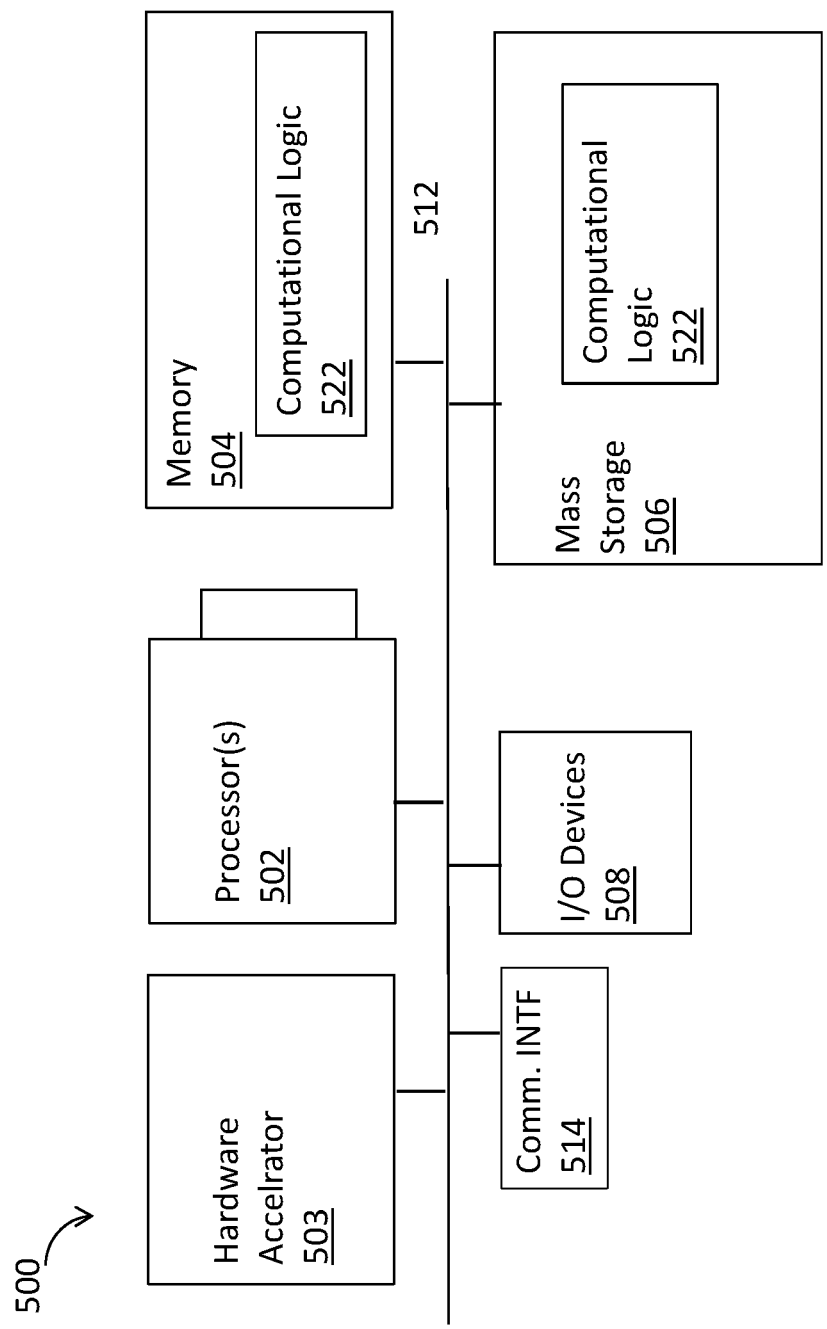
FIG. 5 illustrates an example device suitable for use to practice various aspects of the present disclosure, in accordance with various embodiments.

FIG. 5 illustrates an example computer device 500 that may be suitable as a device to practice selected aspects of the present disclosure. As shown, the computer device 500 may include one or more processors 502, each having one or more processor cores, and associated with one or more hardware accelerators 503 (which may be an ASIC, a FPGA, or a collection of one or more ICs, each having a network of switches, such as networks 200 or 300 of FIG. 2 or 3; and each switch may be similar to the switch 103 of FIG. 1). In alternative embodiments, the hardware accelerator(s) 503 may be part of processor 502, or integrated together on a SOC. Additionally, the computer device 500 may include a memory 504, which may be any one of a number of known random access memory, and mass storage 506 that may be any one of a number of persistent storage medium. In addition, the computer device 500 may include input/output devices 508. Furthermore, the computer device 500 may include communication interfaces 514. Communication interface 514 may be any one of a number of known communication interfaces. The elements may be coupled to each other via system bus 512, which may represent one or more buses. In the case of multiple buses, they may be bridged by one or more bus bridges (not shown).

Each of these elements may perform its conventional functions known in the art, or as described in the current disclosure. In particular, a computation engine within a switch of an IC of accelerator 503 may perform an operation represented by a node of the collective tree, as described in connection with FIGS. 1-4. In various embodiments, computational logic 522 may implement an operating system or one or more application. Computational logic 522 may be implemented by assembler instructions supported by processor(s) 502 or high-level languages, such as, for example, C, that can be compiled into such instructions.

The number, capability and/or capacity of these elements 501-522 may vary, depending on the usage of computer device 500. Otherwise, the constitutions of elements 501-522 are known, and accordingly will not be further described.

As will be appreciated by one skilled in the art, the present disclosure may be embodied as methods or computer program products. Accordingly, the present disclosure, in addition to being embodied in hardware as earlier described, may also include certain software components (including firmware, resident software, micro-code, etc.) or an embodiment combining software and hardware aspects that may all generally be referred to as a "circuit," "module," or "system."

Figure 6:
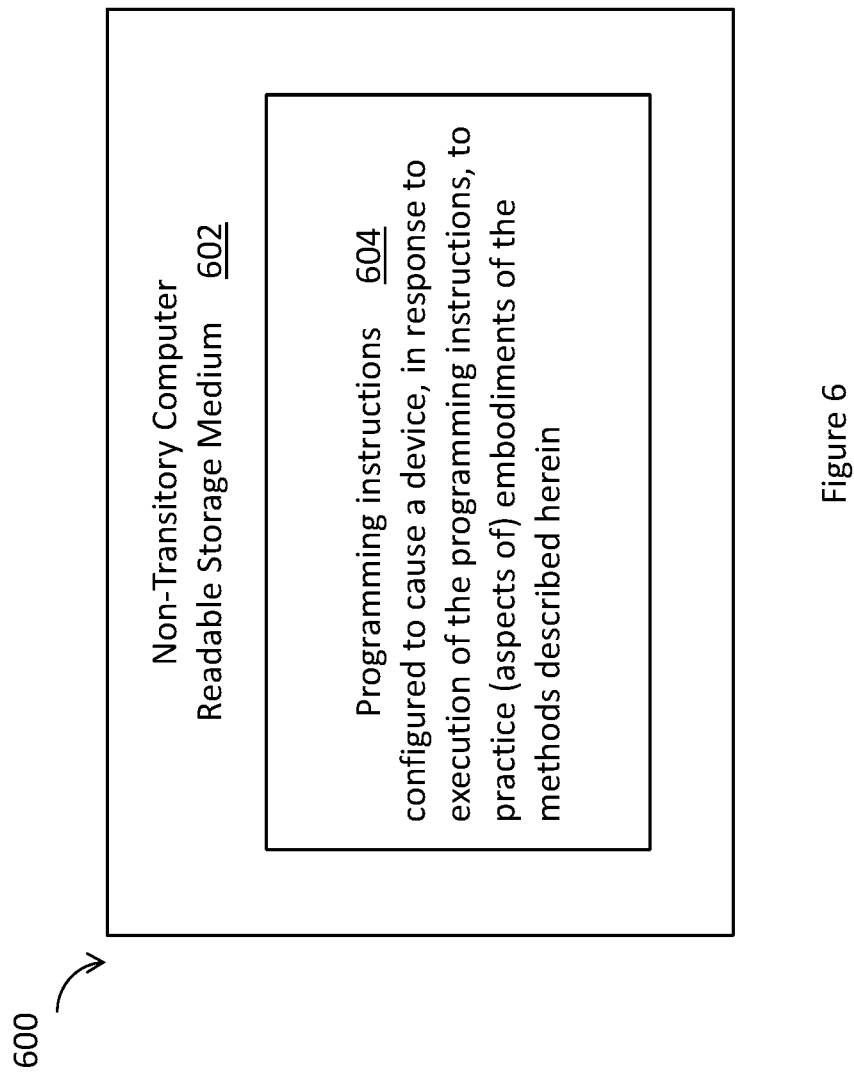
FIG. 6 illustrates a storage medium having instructions for practicing methods described with references to FIGS. 1-5, in accordance with various embodiments.

Furthermore, the present disclosure may include a computer program product embodied in any tangible or non-transitory medium of expression having computer-usable program code embodied in the medium. FIG. 6 illustrates an example computer-readable non-transitory storage medium that may be suitable for use to store instructions that cause an apparatus, in response to execution of the instructions by the apparatus, to practice selected aspects of the present disclosure. As shown, non-transitory computer-readable storage medium 602 may include a number of programming instructions 604. Programming instructions 604 may be configured to enable a device, e.g., device 500, in response to execution of the programming instructions in a controller or a processor, to perform, e.g., various operations of various applications, some of which may correspond to a collective tree, which parallel computations may be accelerator using a network of switches of the ICs of accelerator 503 configured with a network topology to reflect the collective tree, as shown in FIGS. 1-4.

In alternative embodiments, programming instructions 604 may be disposed on multiple computer-readable non-transitory storage media 602 instead. In alternate embodiments, programming instructions 604 may be disposed on computer-readable transitory storage media 602, such as, signals. Any combination of one or more computer usable or computer readable medium(s) may be utilized. The computer-usable or computer-readable medium may be, for example but not limited to, an electronic, magnetic, optical, electromagnetic, infrared, or semiconductor system, apparatus, device, or propagation medium. More specific examples (a non-exhaustive list) of the computer-readable medium would include the following: an electrical connection having one or more wires, a portable computer diskette, a hard disk, a random access memory (RAM), a read-only memory (ROM), an erasable programmable read-only memory (EPROM or Flash memory), an optical fiber, a portable compact disc read-only memory (CD-ROM), an optical storage device, a transmission media such as those supporting the Internet or an intranet, or a magnetic storage device. Note that the computer-usable or computer-readable medium could even be paper or another suitable medium upon which the program is printed, as the program can be electronically captured, via, for instance, optical scanning of the paper or other medium, then compiled, interpreted, or otherwise processed in a suitable manner, if necessary, and then stored in a computer memory. In the context of this document, a computer-usable or computer-readable medium may be any medium that can contain, store, communicate, propagate, or transport the program for use by or in connection with the instruction execution system, apparatus, or device. The computer-usable medium may include a propagated data signal with the computer-usable program code embodied therewith, either in baseband or as part of a carrier wave. The computer usable program code may be transmitted using any appropriate medium, including but not limited to wireless, wireline, optical fiber cable, RF, etc.

Computer program code for carrying out operations of the present disclosure may be written in any combination of one or more programming languages, including an object oriented programming language such as Java, Smalltalk, C++ or the like and conventional procedural programming languages, such as the "C" programming language or similar programming languages. The program code may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider).

The present disclosure is described with reference to flowchart illustrations and/or block diagrams of methods, apparatus (systems) and computer program products according to embodiments of the disclosure. It will be understood that each block of the flowchart illustrations and/or block diagrams, and combinations of blocks in the flowchart illustrations and/or block diagrams, can be implemented by computer program instructions. These computer program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks.

These computer program instructions may also be stored in a computer-readable medium that can direct a computer or other programmable data processing apparatus to function in a particular manner, such that the instructions stored in the computer-readable medium produce an article of manufacture including instruction means which implement the function/act specified in the flowchart and/or block diagram block or blocks.

The computer program instructions may also be loaded onto a computer or other programmable data processing apparatus to cause a series of operational steps to be performed on the computer or other programmable apparatus to produce a computer implemented process such that the instructions which execute on the computer or other programmable apparatus provide processes for implementing the functions/acts specified in the flowchart and/or block diagram block or blocks.

The flowchart and block diagrams in the figures illustrate the architecture, functionality, and operation of possible implementations of systems, methods and computer program products according to various embodiments of the present disclosure. In this regard, each block in the flowchart or block diagrams may represent a module, segment, or portion of code, which comprises one or more executable instructions for implementing the specified logical function(s). It should also be noted that, in some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts, or combinations of special purpose hardware and computer instructions. As used herein, "computer-implemented method" may refer to any method executed by one or more processors, a computer system having one or more processors, a mobile device such as a smartphone (which may include one or more processors), a tablet, a laptop computer, a set-top box, a gaming console, and so forth.

Embodiments may be implemented as a computer process, a computing system or as an article of manufacture such as a computer program product of computer readable media. The computer program product may be a computer storage medium readable by a computer system and encoding a computer program instructions for executing a computer process.

The corresponding structures, material, acts, and equivalents of all means or steps plus function elements in the claims below are intended to include any structure, material or act for performing the function in combination with other claimed elements are specifically claimed. The description of the present disclosure has been presented for purposes of illustration and description, but is not intended to be exhaustive or limited to the disclosure in the form disclosed. Many modifications and variations will be apparent to those of ordinary skill without departing from the scope and spirit of the disclosure. The embodiment are chosen and described in order to best explain the principles of the disclosure and the practical application, and to enable others of ordinary skill in the art to understand the disclosure for embodiments with various modifications as are suited to the particular use contemplated.

Thus various example embodiments of the present disclosure have been described including, but are not limited to:

Example 1 may include an integrated circuit, comprising: a switch having a first number of input ports; a second number of output ports; a configurable crossbar to selectively couple the first number of input ports to the second number of output ports; a computation engine coupled to the first number of input ports, the second number of output ports, and the crossbar, to perform an operation and provide results of the operation to a first group of output ports of the second number of output ports; and one or more registers to selectively configure the first number of input ports and the configurable crossbar, to enable the first number of input ports to selectively pass data to the computation engine to supply the computation engine with operands of the operation, and the computation engine to selectively route results of the operation to the first group of output ports of the second number of output ports, or to enable the first number of input ports to pass through data to a second group of output ports of the second number of output ports; wherein the switch together with other switches forms a network of switches to perform a sequence of operations according to a structure of a collective tree, and the operation performed by the computation engine corresponds to an operation represented by a node of the collective tree.

Example 2 may include the integrated circuit of example 1 and/or some other examples herein, wherein the computation engine is arranged to perform the operation when the operands of the operation are available from the first number of input ports, and further to route results of the operation to the first group of output ports.

Example 3 may include the integrated circuit of example 1 and/or some other examples herein, wherein the one or more registers is further to configure one or more input ports of the first number of input ports neither to pass through data to the second group of output ports nor to supply the data as the operands to the computation engine.

Example 4 may include the integrated circuit of example 1 and/or some other examples herein, wherein the first group of output ports includes only one output port to receive the results of the operation from the computation engine and not to receive data from the first number of input ports.

Example 5 may include the integrated circuit of example 1 and/or some other examples herein, wherein the second group of output ports are to receive data from only the first number of input ports and not to receive the results of the operation from the computation engine.

Example 6 may include the integrated circuit of example 1 and/or some other examples herein, wherein the operation to be performed by the computation engine includes a selected operation of a vector operation, a scalar operation, or a matrix operation.

Example 7 may include the integrated circuit of example 1 and/or some other examples herein, wherein the computation engine includes a tree of arithmetic and logic units (ALU) to perform the operation.

Example 8 may include the integrated circuit of example 1 and/or some other examples herein, wherein the computation engine includes a first register of the one or more registers to indicate input ports of the first number of input ports to supply the operands of the operation, and a second register to indicate the first group of output ports to route the results of the operation.

Example 9 may include the integrated circuit of example 1 and/or some other examples herein, wherein an input port of the first number of input ports includes a configuration register to store a bit vector that indicates whether the input port is to pass through data to an output port of the second number of output ports, to supply the data as an operand in the operation to be performed by the computation engine, or neither to pass through the data nor to supply the data as the operand.

Example 10 may include the integrated circuit of example 9 and/or some other examples herein, wherein the bit vector has a length equal to the second number plus 1, wherein a bit of the second number of bits of the bit vector corresponding to an output port of the second number of output ports, and the second number plus 1 bit of the bit vector represents whether the input port is to supply the data as the operand in the operation to be performed by the computation engine.

Example 11 may include the integrated circuit of example 9 and/or some other examples herein, wherein the configuration register is a first register of the input port, and the input port further includes a second register to indicate the input port is to receive data from an output port of the second number of output ports.

Example 12 may include an integrated circuit, comprising: a plurality of switches, each switch including a first number of input ports and a second number of output ports selectively coupled to one or more of a number of input ports of one or more other switches to form a network of switches on a die; wherein each switch further includes a computation engine configurable to be coupled to selected ones of the first number of input ports, and selected ones of the second number of output ports to perform an operation corresponding to a node of a collective tree, and the network of switches are configurable to jointly take on a network topology reflective of the collective tree, and performs a sequence of operations represented by the collective tree.

Example 13 may include the integrated circuit of example 12 and/or some other examples herein, wherein each switch further includes: one or more registers to selectively configure the first number of input ports, to enable the first number of input ports selectively pass data to the computation engine to supply the computation engine with operands of the operation, and the computation engine to selectively route the results of the operation to a first group of output ports of the second number of output ports, or the first number of input ports to selectively pass through data to a second group of output ports of the second number of output ports.

Example 14 may include the integrated circuit of example 13 and/or some other examples herein, wherein the computation engine is arranged to perform the operation when the operands of the operation are available from the first number of input ports.

Example 15 may include the integrated circuit of example 12 and/or some other examples herein, wherein the switches are configurable such that at least one switch of the group of corresponding switches has one or more descendent switches corresponding to one or more nodes of the collective tree that are descendent nodes of the node to which the at least one switch corresponds, and wherein the computation engine of the at least one switch performs the operation represented by the node when descendent switches have performed operations represented by the descendent nodes.

Example 16 may include the integrated circuit of example 15 and/or some other examples herein, wherein the switches are configurable such that at least one switch of the group of corresponding switches is a root switch corresponding to a root node of the collective tree, and the root switch is to perform an operation represented by the root node of the collective tree after all other switches of the group of corresponding switches have performed operations represented by all other nodes of the collective tree except the root node.

Example 17 may include the integrated circuit of example 16 and/or some other examples herein, wherein the at least one switch configurable as the root switch is further configurable to broadcast a result of the operation performed by the root switch, to at least some of the other switches of the group of corresponding switches.

Example 18 may include the integrated circuit of example 12 and/or some other examples herein, wherein the plurality of switches includes a first switch with the first number of input ports and the second number of output ports, and a second switch having a third number of input ports, and a fourth number of output ports, the first number is different from the third number, or the second number is different from the fourth number.

Example 19 may include the integrated circuit of example 12 and/or some other examples herein, wherein the operation to be performed by the computation engine includes a selected operation of a vector operation, a scalar operation, or a matrix operation.

Example 20 may include a method for performing computations, comprising: selectively passing data, from a first number of input ports of a first switch of an integrated circuit, to a computation engine of the first switch to supply the computation engine with operands of an operation or to a first group of output ports of a second number of output ports of the first switch to bypass the computation engine of the first switch; performing, by the computation engine of the first switch, the operation when all operands of the operation are passed from the first number of input ports; forwarding results of the operation to a second group of output ports of the second number of output ports of the first switch; and repeating the selectively passing, the performing, and the forwarding on at least a second switch of the integrated circuit coupled to the first switch.

Example 21 may include the method of example 20 and/or some other examples herein, wherein the selectively passing, the performing, and the forwarding performed on the first switch and the repeating on at least the second switch are performed as part of a performance of a sequence of operations represented by a collective tree using a network of switches on the integrated circuit having at least the first and second switches, with the performance of the selectively passing, the performing, and the forwarding on the first switch corresponding to performance of an operation of a node of the collective tree.

Example 22 may include the method of example 21 and/or some other examples herein, wherein the first switch has one or more descendent switches corresponding to one or more nodes of the collective tree that are descendent nodes of the node, and wherein the performing is performed when the descendent switches have performed operations represented by the descendent nodes.

Example 23 may include the method of example 20 and/or some other examples herein, wherein the selectively passing comprises selectively passing in accordance with connectivity information configured in one or more registers of the first switch.

Example 24 may include the method of example 20 and/or some other examples herein, wherein performing comprises performing a selected one of a vector operation, a scalar operation, or a matrix operation.

Example 25 may include the method of example 20 and/or some other examples herein, wherein forwarding comprises selectively routing results of the operation to the second group of output ports of the first switch in accordance with a bit vector stored in the one or more registers of the first switch.

Various embodiments may include any suitable combination of the above-described embodiments including alternative (or) embodiments of embodiments that are described in conjunctive form (and) above (e.g., the "and" may be "and/or"). Furthermore, some embodiments may include one or more articles of manufacture (e.g., non-transitory computer-readable media) having instructions, stored thereon, that when executed result in actions of any of the above-described embodiments. Moreover, some embodiments may include apparatuses or systems having any suitable means for carrying out the various operations of the above-described embodiments.

The above description of illustrated implementations, including what is described in the Abstract, is not intended to be exhaustive or to limit the embodiments of the present disclosure to the precise forms disclosed. While specific implementations and examples are described herein for illustrative purposes, various equivalent modifications are possible within the scope of the present disclosure, as those skilled in the relevant art will recognize.

These modifications may be made to embodiments of the present disclosure in light of the above detailed description. The terms used in the following claims should not be construed to limit various embodiments of the present disclosure to the specific implementations disclosed in the specification and the claims. Rather, the scope is to be determined entirely by the following claims, which are to be construed in accordance with established doctrines of claim interpretation.

Although certain embodiments have been illustrated and described herein for purposes of description this application is intended to cover any adaptations or variations of the embodiments discussed herein. Therefore, it is manifestly intended that embodiments described herein be limited only by the claims.

What is claimed is:

1. An integrated circuit, comprising:
a switch having:
a first number of input ports;
a second number of output ports;
a configurable crossbar to selectively couple the first number of input ports to the second number of output ports;
a computation engine coupled to the first number of input ports, the second number of output ports, and the crossbar, to perform an operation and provide results of the operation to a first group of output ports of the second number of output ports; and
one or more registers to selectively configure the first number of input ports and the configurable crossbar, to enable the first number of input ports to selectively pass data to the computation engine to supply the computation engine with operands of the operation, and the computation engine to selectively route results of the operation to the first group of output ports of the second number of output ports, or to enable the first number of input ports to pass through data to a second group of output ports of the second number of output ports;
wherein the switch together with other switches forms a network of switches to perform a sequence of operations according to a structure of a collective tree, and the operation performed by the computation engine corresponds to an operation represented by a node of the collective tree.

2. The integrated circuit of claim 1, wherein the computation engine is arranged to perform the operation when the operands of the operation are available from the first number of input ports, and further to route results of the operation to the first group of output ports.

3. The integrated circuit of claim 1, wherein the one or more registers is further to configure one or more input ports of the first number of input ports neither to pass through data to the second group of output ports nor to supply the data as the operands to the computation engine.

4. The integrated circuit of claim 1, wherein the first group of output ports includes only one output port to receive the results of the operation from the computation engine and not to receive data from the first number of input ports.

5. The integrated circuit of claim 1, wherein the second group of output ports are to receive data from only the first number of input ports and not to receive the results of the operation from the computation engine.

6. The integrated circuit of claim 1, wherein the operation to be performed by the computation engine includes a selected operation of a vector operation, a scalar operation, or a matrix operation.

7. The integrated circuit of claim 1, wherein the computation engine includes a tree of arithmetic and logic units (ALU) to perform the operation.

8. The integrated circuit of claim 1, wherein the computation engine includes a first register of the one or more registers to indicate input ports of the first number of input ports to supply the operands of the operation, and a second register to indicate the first group of output ports to route the results of the operation.

9. The integrated circuit of claim 1, wherein an input port of the first number of input ports includes a configuration register to store a bit vector that indicates whether the input port is to pass through data to an output port of the second number of output ports, to supply the data as an operand in the operation to be performed by the computation engine, or neither to pass through the data nor to supply the data as the operand.

10. The integrated circuit of claim 9, wherein the bit vector has a length equal to the second number plus 1, wherein a bit of the second number of bits of the bit vector corresponding to an output port of the second number of output ports, and the second number plus 1 bit of the bit vector represents whether the input port is to supply the data as the operand in the operation to be performed by the computation engine.

11. The integrated circuit of claim 9, wherein the configuration register is a first register of the input port, and the input port further includes a second register to indicate the input port is to receive data from an output port of the second number of output ports.

12. An integrated circuit, comprising:
a plurality of switches, each switch including a first number of input ports and a second number of output ports selectively coupled to one or more of a number of input ports of one or more other switches to form a network of switches on a die;
wherein each switch further includes a computation engine configurable to be coupled to selected ones of the first number of input ports, and selected ones of the second number of output ports to perform an operation corresponding to a node of a collective tree, and the network of switches are configurable to jointly take on a network topology reflective of the collective tree, and performs a sequence of operations represented by the collective tree.

13. The integrated circuit of claim 12, wherein each switch further includes:
one or more registers to selectively configure the first number of input ports, to enable the first number of input ports to selectively pass data to the computation engine to supply the computation engine with operands of the operation, and the computation engine to selectively route the results of the operation to a first group of output ports of the second number of output ports, or the first number of input ports to selectively pass through data to a second group of output ports of the second number of output ports.

14. The integrated circuit of claim 13, wherein the computation engine is arranged to perform the operation when the operands of the operation are available from the first number of input ports.

15. The integrated circuit of claim 12, wherein the switches are configurable such that at least one switch of a group of corresponding switches has one or more descendent switches corresponding to one or more nodes of the collective tree that are descendent nodes of the node to which the at least one switch corresponds, and wherein the computation engine of the at least one switch performs the operation represented by the node when descendent switches have performed operations represented by the descendent nodes.

16. The integrated circuit of claim 15, wherein the switches are configurable such that at least one switch of the group of corresponding switches is a root switch corresponding to a root node of the collective tree, and the root switch is to perform an operation represented by the root node of the collective tree after all other switches of the group of corresponding switches have performed operations represented by all other nodes of the collective tree except the root node.

17. The integrated circuit of claim 16, wherein the at least one switch configurable as the root switch is further configurable to broadcast a result of the operation performed by the root switch, to at least some of the other switches of the group of corresponding switches.

18. The integrated circuit of claim 12, wherein the plurality of switches includes a first switch with the first number of input ports and the second number of output ports, and a second switch having a third number of input ports, and a fourth number of output ports, the first number is different from the third number, or the second number is different from the fourth number.

19. The integrated circuit of claim 12, wherein the operation to be performed by the computation engine includes a selected operation of a vector operation, a scalar operation, or a matrix operation.

20. A method for performing computations, comprising:
selectively passing data, from a first number of input ports of a first switch of an integrated circuit, to a computation engine of the first switch to supply the computation engine with operands of an operation or to a first group of output ports of a second number of output ports of the first switch to bypass the computation engine of the first switch;
performing, by the computation engine of the first switch, the operation when all operands of the operation are passed from the first number of input ports;
forwarding results of the operation to a second group of output ports of the second number of output ports of the first switch; and
repeating the selectively passing, the performing, and the forwarding on at least a second switch of the integrated circuit coupled to the first switch.

21. The method of claim 20, wherein the selectively passing, the performing, and the forwarding performed on the first switch and the repeating on at least the second switch are performed as part of a performance of a sequence of operations represented by a collective tree using a network of switches on the integrated circuit having at least the first and second switches, with the performance of the selectively passing, the performing, and the forwarding on the first switch corresponding to performance of an operation of a node of the collective tree.

22. The method of claim 21, wherein the first switch has one or more descendent switches corresponding to one or more nodes of the collective tree that are descendent nodes of the node, and wherein the performing is performed when the descendent switches have performed operations represented by the descendent nodes.

23. The method of claim 20, wherein the selectively passing comprises selectively passing in accordance with connectivity information configured in one or more registers of the first switch.

24. The method of claim 20, wherein performing comprises performing a selected one of a vector operation, a scalar operation, or a matrix operation.

25. The method of claim 20, wherein forwarding comprises selectively routing results of the operation to the second group of output ports of the first switch in accordance with a bit vector stored in one or more registers of the first switch.

* * * * *

UNITED STATES PATENT AND TRADEMARK OFFICE
CERTIFICATE OF CORRECTION

PATENT NO. : 10,476,492 B2
APPLICATION NO. : 16/201915
DATED : November 12, 2019
INVENTOR(S) : Ankit More et al.

Page 1 of 1

It is certified that error appears in the above-identified patent and that said Letters Patent is hereby corrected as shown below:

In the Specification

Column 1:
Line 4 add the following Statement of Government Interest section after the Title:
"Statement Of Government Interest
This invention was made with Government support under Agreement No. HR0011-17-3-0004, awarded by DARPA. The Government has certain rights in the invention."

Signed and Sealed this
Thirty-first Day of January, 2023

Katherine Kelly Vidal
*Director of the United States Patent and Trademark Office*